(12) United States Patent
Chang et al.

(10) Patent No.: US 11,515,288 B2
(45) Date of Patent: Nov. 29, 2022

(54) PROTECTIVE LAYER FOR CONTACT PADS IN FAN-OUT INTERCONNECT STRUCTURE AND METHOD OF FORMING SAME

(71) Applicant: Taiwan Semiconductor Manufacturing Co., Ltd., Hsinchu (TW)

(72) Inventors: Chin-Chuan Chang, Zhudong Township (TW); Tsei-Chung Fu, Toufen Township (TW); Jing-Cheng Lin, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 188 days.

(21) Appl. No.: 16/934,631

(22) Filed: Jul. 21, 2020

(65) Prior Publication Data
US 2020/0350280 A1    Nov. 5, 2020

Related U.S. Application Data

(63) Continuation of application No. 15/938,451, filed on Mar. 28, 2018, now Pat. No. 10,748,869, which is a continuation of application No. 14/100,987, filed on Dec. 9, 2013, now Pat. No. 9,941,244.

(51) Int. Cl.
*H01L 21/56* (2006.01)
*H01L 23/00* (2006.01)
(Continued)

(52) U.S. Cl.
CPC .......... *H01L 24/96* (2013.01); *H01L 23/3185* (2013.01); *H01L 23/5226* (2013.01); *H01L 24/19* (2013.01); *H01L 21/561* (2013.01); *H01L 21/568* (2013.01); *H01L 24/13* (2013.01); *H01L 24/16* (2013.01); *H01L 2224/0239* (2013.01); *H01L 2224/02381* (2013.01); *H01L 2224/0401* (2013.01); *H01L 2224/04105* (2013.01); *H01L 2224/05018* (2013.01); *H01L 2224/05124* (2013.01); *H01L 2224/05144* (2013.01); *H01L 2224/05147* (2013.01); *H01L 2224/05569* (2013.01); *H01L 2224/05572* (2013.01); *H01L 2224/05647* (2013.01); *H01L 2224/05666* (2013.01); *H01L 2224/12105* (2013.01); *H01L 2224/13111* (2013.01); *H01L 2224/13147* (2013.01); *H01L 2224/16145* (2013.01); *H01L 2224/16225* (2013.01);
(Continued)

(58) Field of Classification Search
None
See application file for complete search history.

(56) References Cited

U.S. PATENT DOCUMENTS 6,165,912 A    12/2000  McConnell et al.
6,770,971 B2    8/2004  Kouno et al.
(Continued)

*Primary Examiner* — Bradley Smith
(74) *Attorney, Agent, or Firm* — Slater Matsil, LLP

(57) ABSTRACT

A method includes providing a die having a contact pad on a top surface and forming a conductive protective layer over the die and covering the contact pad. A molding compound is formed over the die and the conductive protective layer. The conductive protective layer is exposed using a laser drilling process. A redistribution layer (RDL) is formed over the die. The RDL is electrically connected to the contact pad through the conductive protective layer.

20 Claims, 18 Drawing Sheets

(51) Int. Cl.
*H01L 23/522* (2006.01)
*H01L 23/31* (2006.01)

(52) U.S. Cl.
CPC .... *H01L 2224/214* (2013.01); *H01L 2224/94* (2013.01); *H01L 2924/00* (2013.01); *H01L 2924/01029* (2013.01); *H01L 2924/01047* (2013.01); *H01L 2924/12042* (2013.01); *H01L 2924/14* (2013.01); *H01L 2924/181* (2013.01); *H01L 2924/18162* (2013.01)

(56) References Cited

U.S. PATENT DOCUMENTS

| | | |
|---|---|---|
| 7,075,181 B2 | 7/2006 | Wakabayashi et al. |
| 7,489,032 B2 | 2/2009 | Jobetto |
| 7,776,655 B2 | 8/2010 | Do et al. |
| 7,993,972 B2 | 8/2011 | Lin et al. |
| 8,624,353 B2 | 1/2014 | Lin et al. |
| 8,765,531 B2 | 7/2014 | Gatterbauer et al. |
| 2007/0001301 A1* | 1/2007 | Wang ............... H01L 24/05 257/734 |
| 2007/0102815 A1 | 5/2007 | Kaufmann et al. |
| 2013/0175696 A1 | 7/2013 | Lin et al. |
| 2013/0181338 A1* | 7/2013 | Lu ............... H01L 23/3157 257/737 |
| 2013/0200528 A1 | 8/2013 | Lin et al. |
| 2014/0124914 A1 | 5/2014 | Lin et al. |
| 2015/0108642 A1* | 4/2015 | Daubenspeck ......... H01L 24/13 257/738 |

* cited by examiner

PROTECTIVE LAYER FOR CONTACT PADS IN FAN-OUT INTERCONNECT STRUCTURE AND METHOD OF FORMING SAME

PRIORITY CLAIM AND CROSS-REFERENCE

This application is a continuation of U.S. application Ser. No. 15/938,451, entitled "Protective Layer for Contact Pads in Fan-out Interconnect Structure and Method of Forming Same," filed on Mar. 28, 2018, which is a continuation of U.S. application Ser. No. 14/100,987, entitled "Protective Layer for Contact Pads in Fan-out Interconnect Structure and Method of Forming Same," filed on Dec. 9, 2013, now U.S. Pat. No. 9,941,244, issued on Apr. 10, 2018, which applications are hereby incorporated herein by reference.

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, contact pads are formed and exposed on the surface of the respective die. Electrical connections are made through the metal pads to connect the die to a package substrate or another die.

In an aspect of conventional packaging technologies, such as fan-out packaging, redistribution layers (RDLs) may be formed over a die and electrically connected to the contact pads. Input/output (I/O) pads, such as solder balls, may then be formed to electrically connect to the contact pads through the RDLs. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to a specific context, namely a fan-out packaging technology such as fan-out wafer level packaging (FO-WLP). Various other embodiments, however, may be applied to other packaging technologies.

Figure 1A:
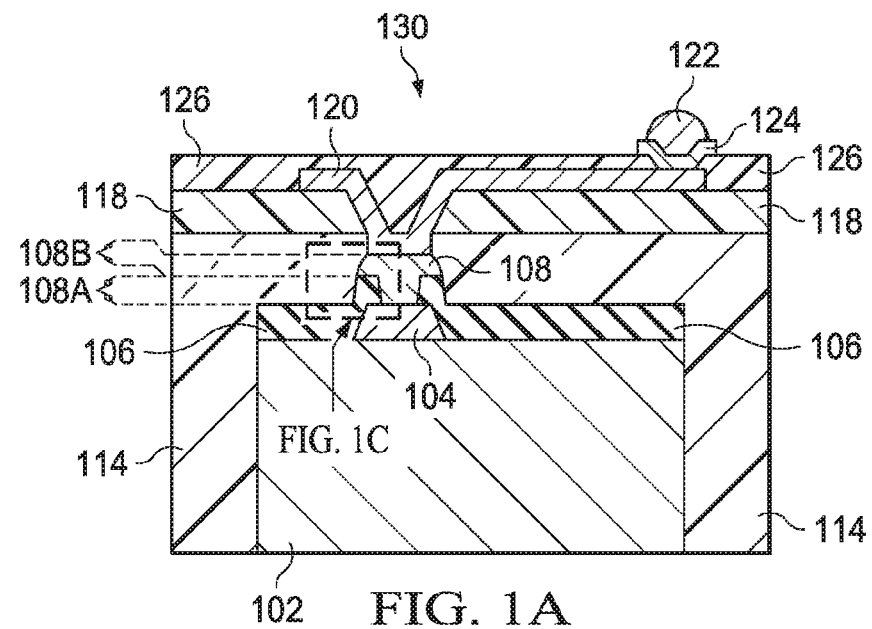
FIGS. 1A through 1C are cross sectional and top down views of a portions of a fan-out package in accordance with various embodiments.

FIG. 1A is a cross-sectional view of a portion of an integrated circuit (IC) structure 130 in accordance with various embodiments. IC structure 130 includes a die 102 and a redistribution layer (RDL) 120 (sometimes referred to as a post-passivation interconnect (PPI)) over die 102. RDL 120 extends through polymer layers 126 and 118 to electrically connect to die 102. Lateral portions of RDL 120 may extend beyond edges of die 102 and over a molding compound 114. A conductive bump 122 in a under bump metallurgy (UBM) 124 is electrically connected to RDL 120 and may serve as an input/output pad. Therefore, the resulting IC structure 130 may be referred to as a fan-out package. Die 102 includes one or more contact pads 104, which electrically connect RDL 120 to various devices (not shown) in die 102. A passivation layer 106 may be formed over die 102, and passivation layer 106 may cover edges of contact pads 104.

Figure 1B:
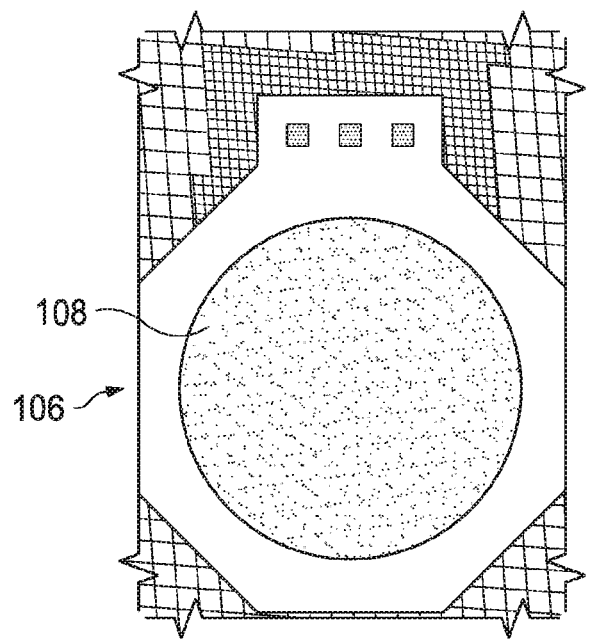

RDL 120 may be electrically connected to contact pad 104 through a metallic protective layer 108, which may be in physical contact with contact pad 104. Protective layer 108 may be formed using one or more electroless plating processes of a metallic compound having a relatively high-melting point, for example, greater than about 800° Celsius. Protective layer 108 may have a portion 108A in passivation layer 106 and a portion 108B over passivation layer 106. Portion 108B may be wider than portion 108A. That is, protective layer 108 may extend over and cover edges of passivation layer 106. FIG. 1B illustrates a top-down view of protective layer 108. As illustrated in FIG. 1B, a top surface of contact pad 104 may be covered by protective layer 108. Furthermore, portion 108A may or may not be formed in the same electroless plating process and may or may not comprise the same materials as portion 108B. For example, portion 108A may be formed in a first electroless plating process using a metal having good adhesive qualities (e.g., nickel) while portion 108B may be formed in a second electroless plating process using a different metal (e.g., copper).

Figure 1C:
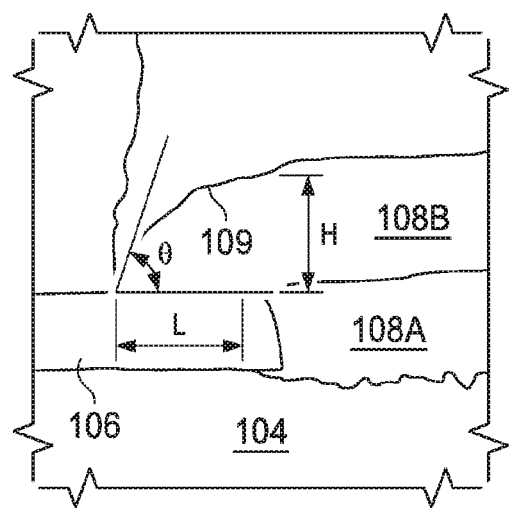

FIG. 1C illustrates a detailed cross-sectional view of protective layer 108 in IC structure 130. Because protective layer 108 may be formed using electroless plating processes, the profile of protective layer 108 may be irregular. For example, as indicated by solid line 109, a top surface of protective layer 108 (e.g., portion 108B) may be uneven and may not be substantially planar. Sidewalls of protective layer 108 (e.g., portion 108B over passivation layer 106) may also be irregular and may or may not be substantially perpendicular. In various embodiments an angle θ (defined by a line tangent to a sidewall of protective layer 108 and a top surface of passivation layer 106) may be between about 45° and about 90°. Furthermore, vertical and lateral deposition (e.g., growth due to electroless plating) of protective layer 108 may be at a substantially equal rate. Thus, for a portion of protective layer 108 extending over passivation layer 106, a vertical dimension H may be substantially equal to a horizontal dimension L. Protective layer 108 shields contact pad 104 from damage during laser drilling. Thus, the inclusion of protective layer 108 allows laser drilling to be used during the formation of IC structure 130 without damaging contact pad 104 while still allowing for electrical connections to contact pad 104.

Figure 2A:
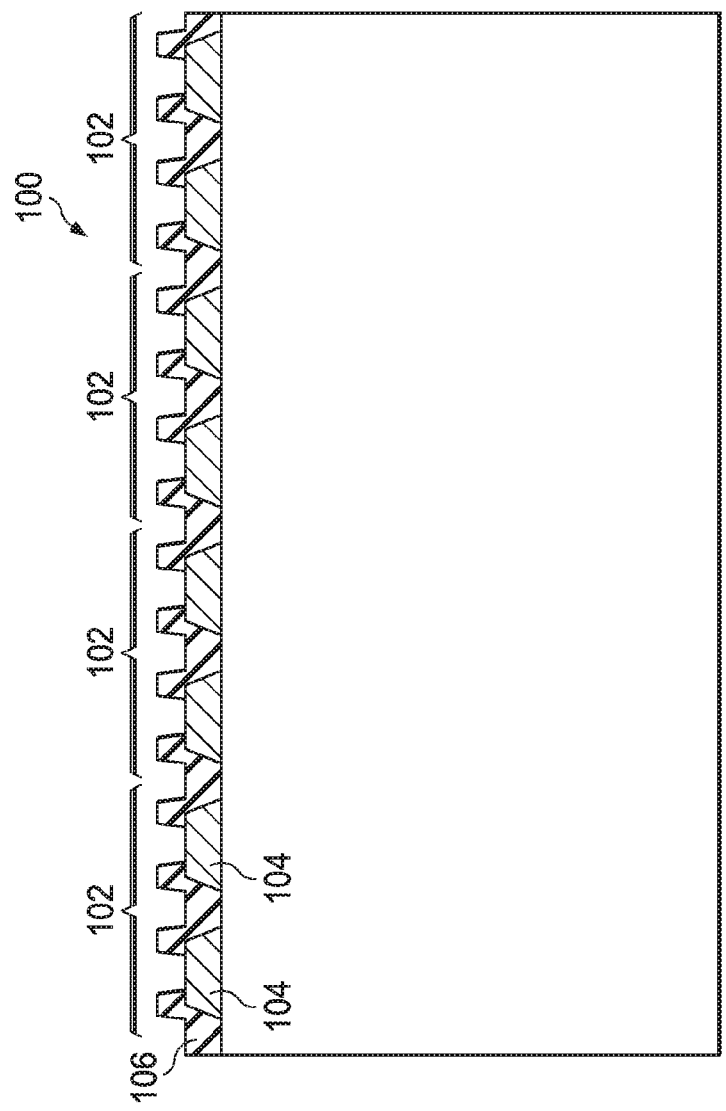
FIGS. 2A through 2J are cross-sectional views of various intermediary stages of manufacture of a fan-out package in accordance with various embodiments.

FIGS. 2A-2J are cross-sectional views of intermediate stages of manufacture of the IC structure 130 of FIG. 1A through 1C in accordance with various embodiments. FIG. 2A illustrates a cross-sectional view of a wafer 100 having a plurality of dies 102. Dies 102 may include a substrate, active devices, and an interconnect structure (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. An interconnect structure may be formed over the active devices and the substrate.

The interconnect structure may include an inter-layer dielectric (ILD)/inter-metal dielectric layers (IMDs) formed over the substrate. The ILD and IMDs may be formed of low-k dielectric materials having k values, for example, lower than about 4.0. In some embodiments, the ILD and IMDs comprise silicon oxide, SiCOH, and the like.

Contact pads 104 are formed over the interconnect structure and may be electrically coupled to the active devices through various metallic lines and vias in the interconnect structure. Contact pads 104 may be made of a metallic material such as aluminum, although other metallic materials may also be used. A passivation layer 106 may be formed over dies 102 of non-organic materials such as silicon oxide, un-doped silicate glass, silicon oxynitride, and the like. Passivation layer 106 may extend over and cover edge portions of contact pads 104. Openings may be formed in portions of the passivation layer that cover contact pads 104, exposing at least a portion of contact pads 104. The various features of die 102 may be formed by any suitable method and are not described in further detail herein.

Figure 2B:
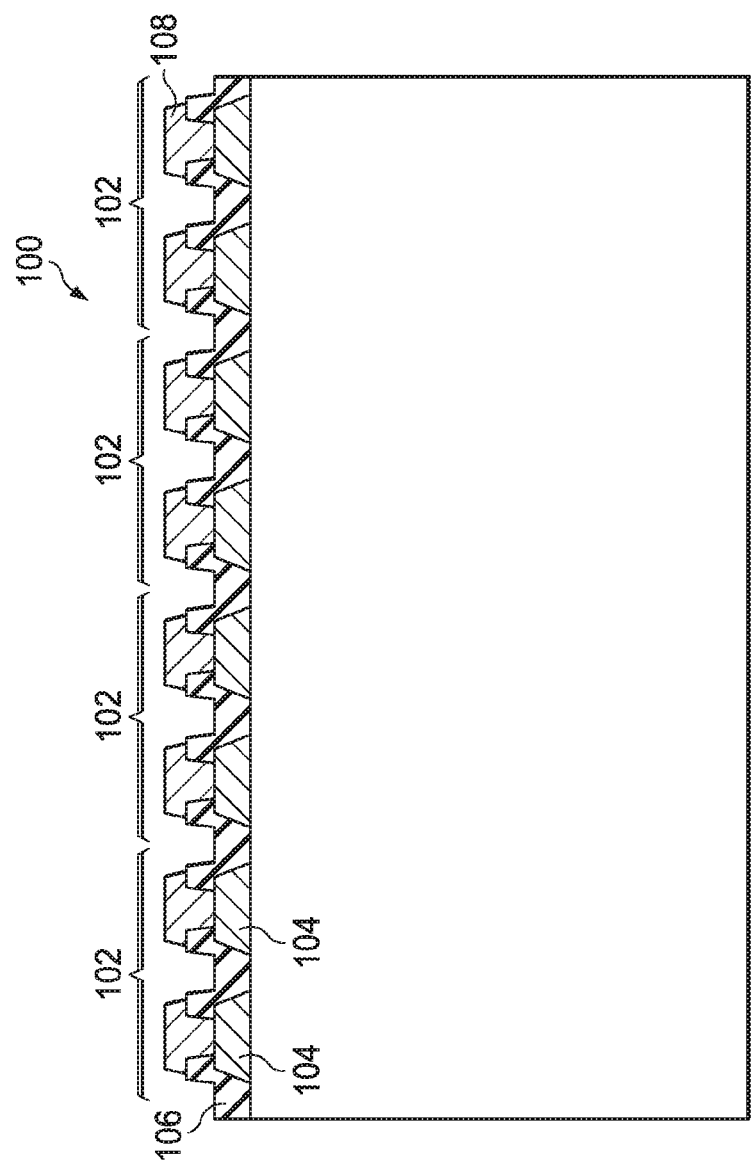

FIG. 2B illustrates the formation of a metallic protective layer 108 over contact pads 104. Protective layer 108 may be formed by electroless plating contact pads 104 with a metallic material. For example, a pre-treatment may be applied to contact pads 104 to clean the surface of contact pads 104 and to improve surface properties for plating (e.g., to roughen the surface texture of contact pads 104). This pre-treatment process generally includes the use of one or more chemical washes (e.g., acid washes) and/or wet etching processes on contact pads 104. A seed layer (not shown) may then be formed over dies 102. Subsequently, dies 102, including contact pads 104, may be submerged in an electroless bath comprising a metallic material at an appropriate temperature (e.g., between about 60 to 80 degrees Celsius), which results in the metallization of contact pads 104. As a result, contact pads 104 are plated with the metallic material. Subsequently, a wafer cleaning process may be applied to remove any residual materials.

The metallic material (sometimes referred to as a metal paste) used for metallization may be any suitable material having a relatively high melting point, for example, greater than about 800° Celsius. For example, the metal may be nickel (Ni), copper (Cu), silver (Ag), gold (Au), palladium (Pd), platinum (Pt), tin (Sn), zinc (Zn), Ruthenium (Ru), a noble metal, or a combination of these. In an embodiment, protective layer 108 is a nickel (Ni) layer. In some embodiments, the protective layer 108 is a nickel alloy layer, for example nickel-palladium-gold (NiPdAu), nickel-gold (NiAu), nickel-palladium (NiPd), or the like.

In some embodiments, more than one electroless plating processes may be applied to form protective layers 108. In such embodiments, different portions of protective layers 108 may comprise different metals. For example, the formation of protective layer 108 may include a first electroless plating process using a metal having improved adhesion properties (e.g., nickel) on contact pads 104. Subsequently, a second electroless plating process may be applied using a metal having improved protective properties (e.g., copper).

Protective layer 108 may extend over and cover portions of passivation layer 106. That is, protective layer may have a first portion (e.g., 108A in FIG. 1A) contacting contact pads 104 and a second portion (e.g., 108B in FIG. 1A) over the first portion where the second portion is wider than the first portion. In some embodiments, protective layer 108 is between about 2 μm to about 5 μm thick. Protective layer 108 may have a width of about 65 μm. Protective layer 108 prevents contact pads 104 from suffering damage during laser drilling in subsequent manufacture steps. As discussed in greater detail below, electrical contact to contact pads 104 will be made using conductive protective layer 108. Protective layer 108 provides protection to the underlying layer during subsequent processes, such as laser drilling, thereby reducing or preventing damage to contact pads 104.

Figure 2C:
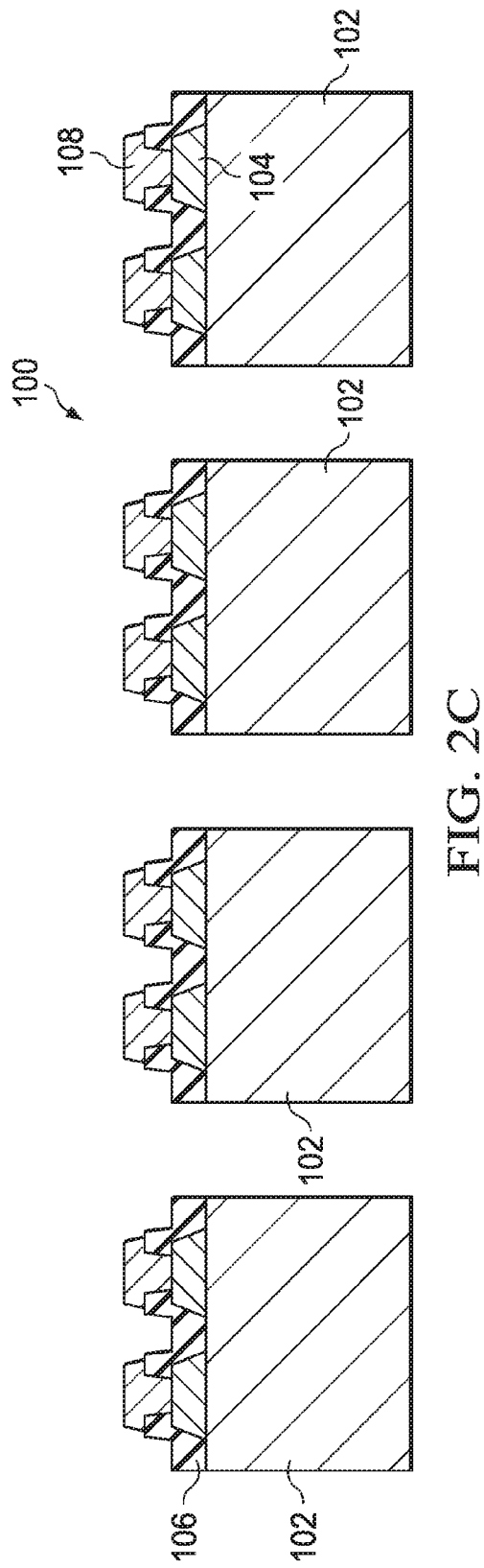
Figure 2D:
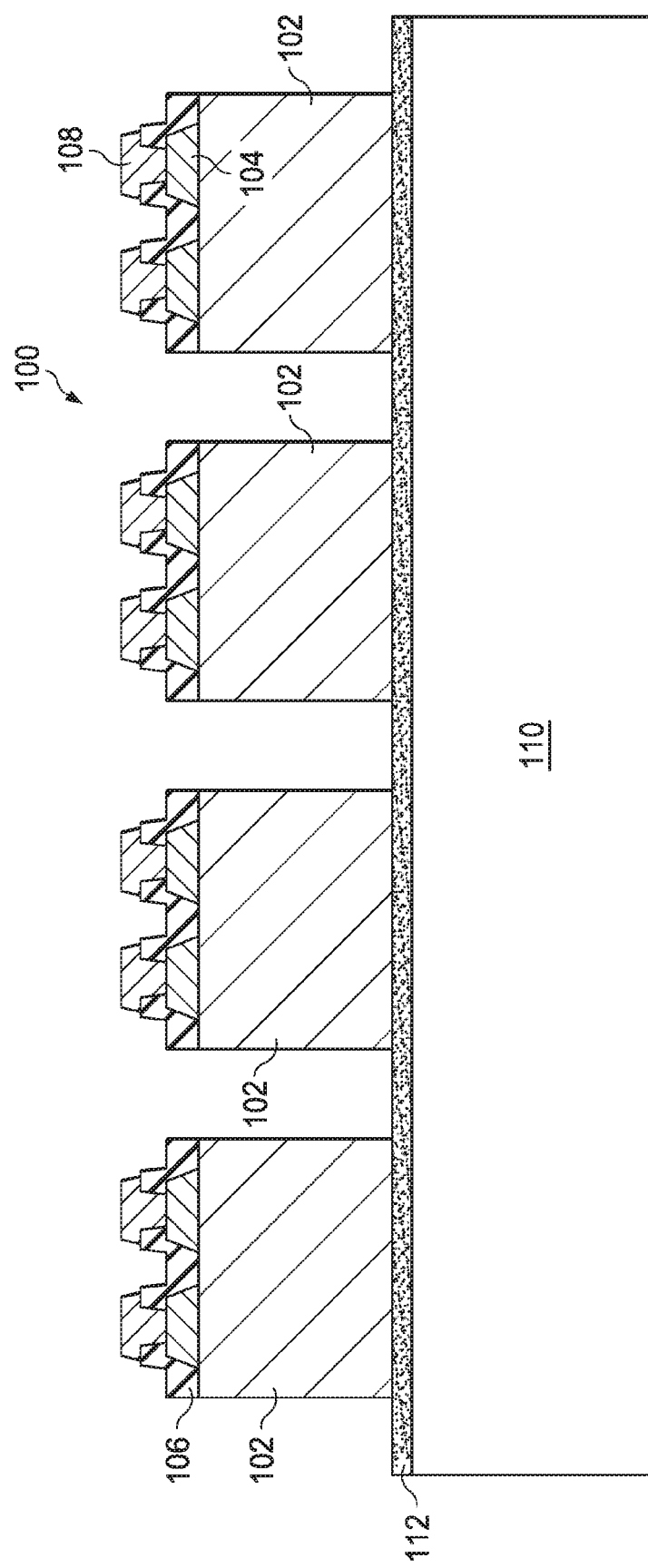

In FIG. 2C, dies 102 may be singulated from wafer 100. FIG. 2D illustrates the placement of dies 102 on a carrier 110 after singulation (e.g., through the use of an applicable pick-and-place tool). Carrier 110 may be made of a suitable material, for example, glass or a carrier tape. Dies 102 may be affixed to carrier 110 through one or more adhesive layers 112. Adhesive layers 112 may be formed of any temporary adhesive material such as ultraviolet (UV) tape, wax, glue, or the like. Adhesive layers 112 may further include a die attach film (DAF), which may have optionally been formed under dies 102 prior to their placement on carrier 110.

Figure 2E:
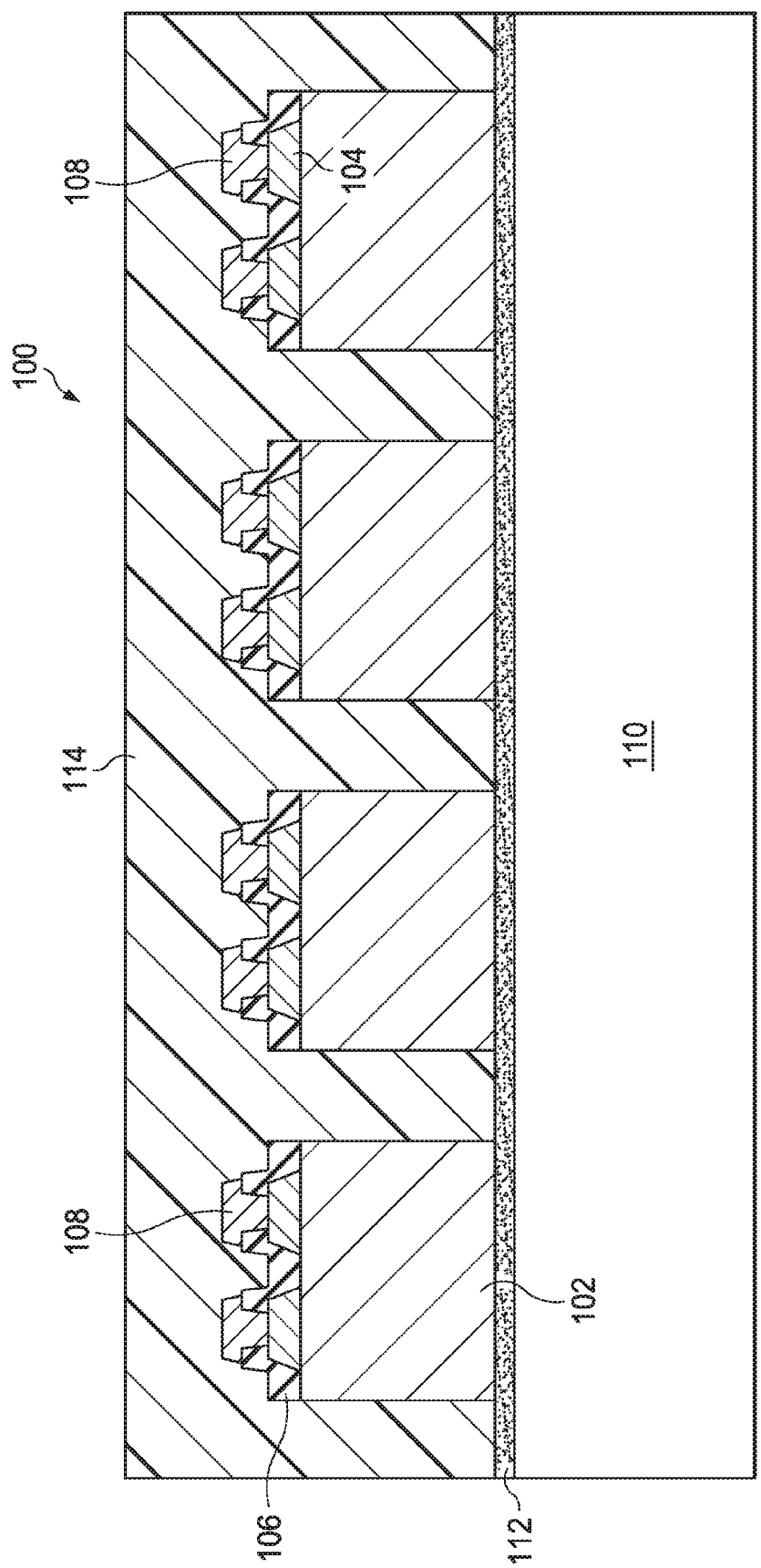

With reference now to FIG. 2E, a molding compound 114 may be used to fill gaps between dies 102 and to cover top surfaces of dies 102. Molding compound 114 may include any suitable material such as an epoxy resin, a molding underfill, or the like. Suitable methods for forming molding compound 114 may include compressive molding, transfer molding, liquid encapsulant molding, or the like. For example, molding compound 114 which may be dispensed between dies 102 in liquid form. A curing process may then be performed to solidify molding compound 114.

Figure 2F:
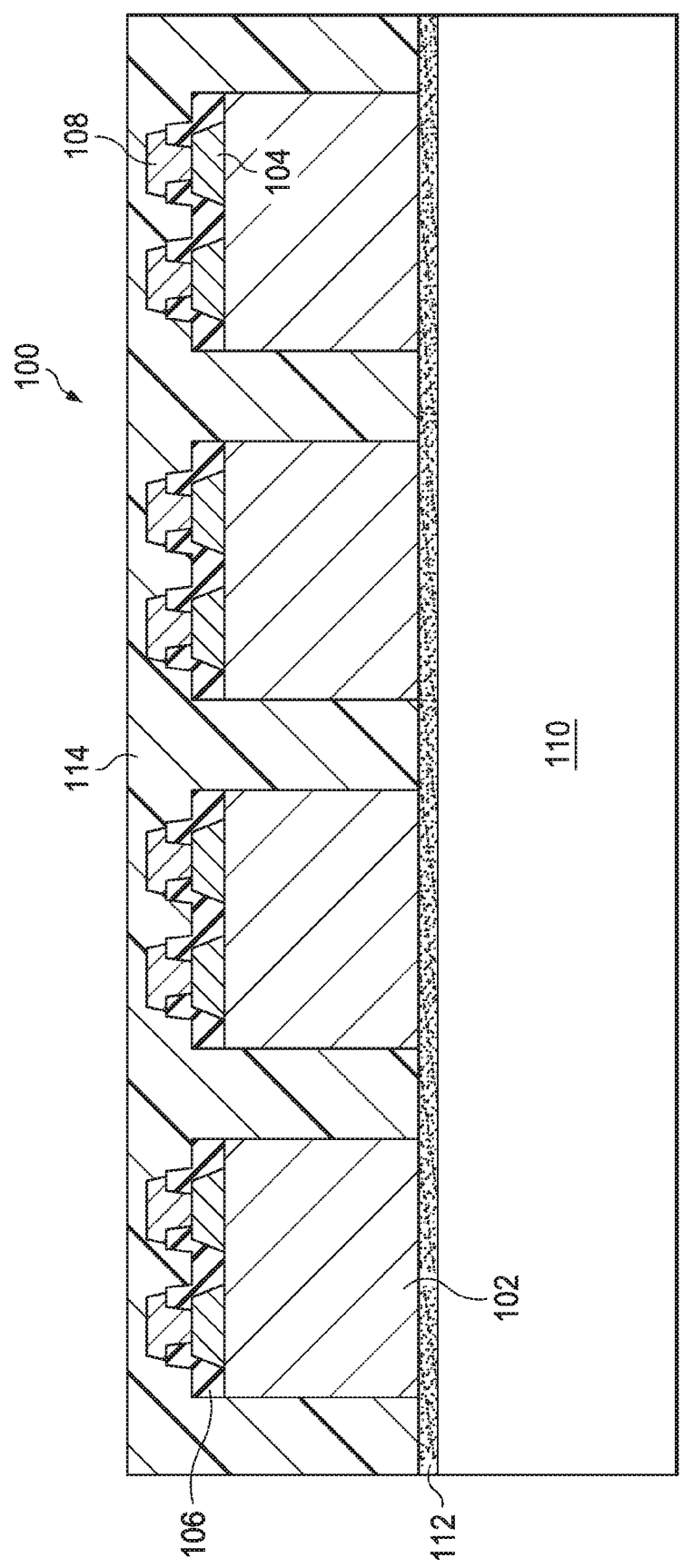

In FIG. 2F, a planarization process, such as a grinding process (e.g., a chemical-mechanical polish (CMP) or mechanical grinding) or etch back, may be performed on molding compound 114 to achieve a desired thickness.

Figure 2G:
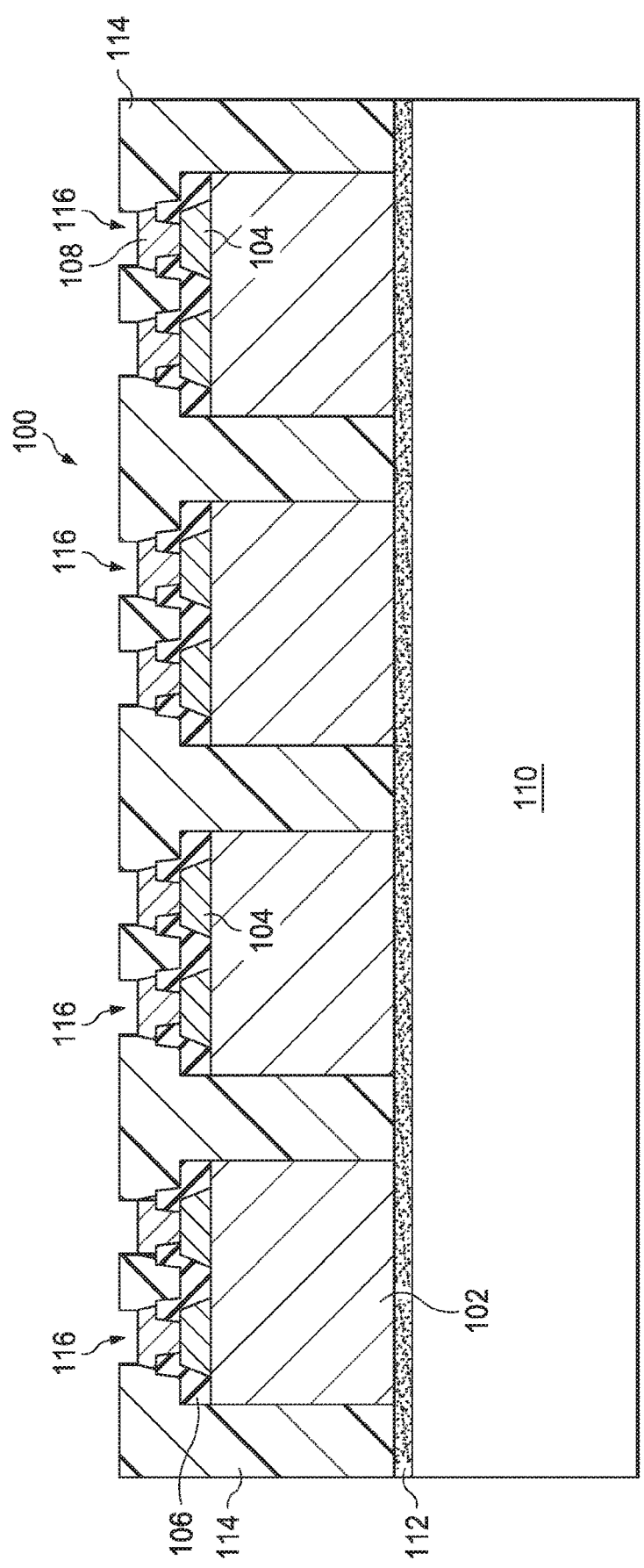

FIG. 2G illustrates the formation of openings 116 in molding compound 114, which expose portions of protective layer 108 of dies 102. Openings 116 may be formed using a laser drilling process, which is a lower cost alternative to traditional photolithography and etching techniques. The inclusion of protective layer 108 prevents damage to contact pads 104 during the laser drilling process. The type of laser used may depend on layout design. For example, an ultraviolet (UV) laser may be used to create openings 116 having a finer pitch, whereas a carbon dioxide ($CO_2$) laser may be used to create openings 116 having a larger pitch. Of course, other types of lasers may be used in alternative embodiments.

Figure 2H:
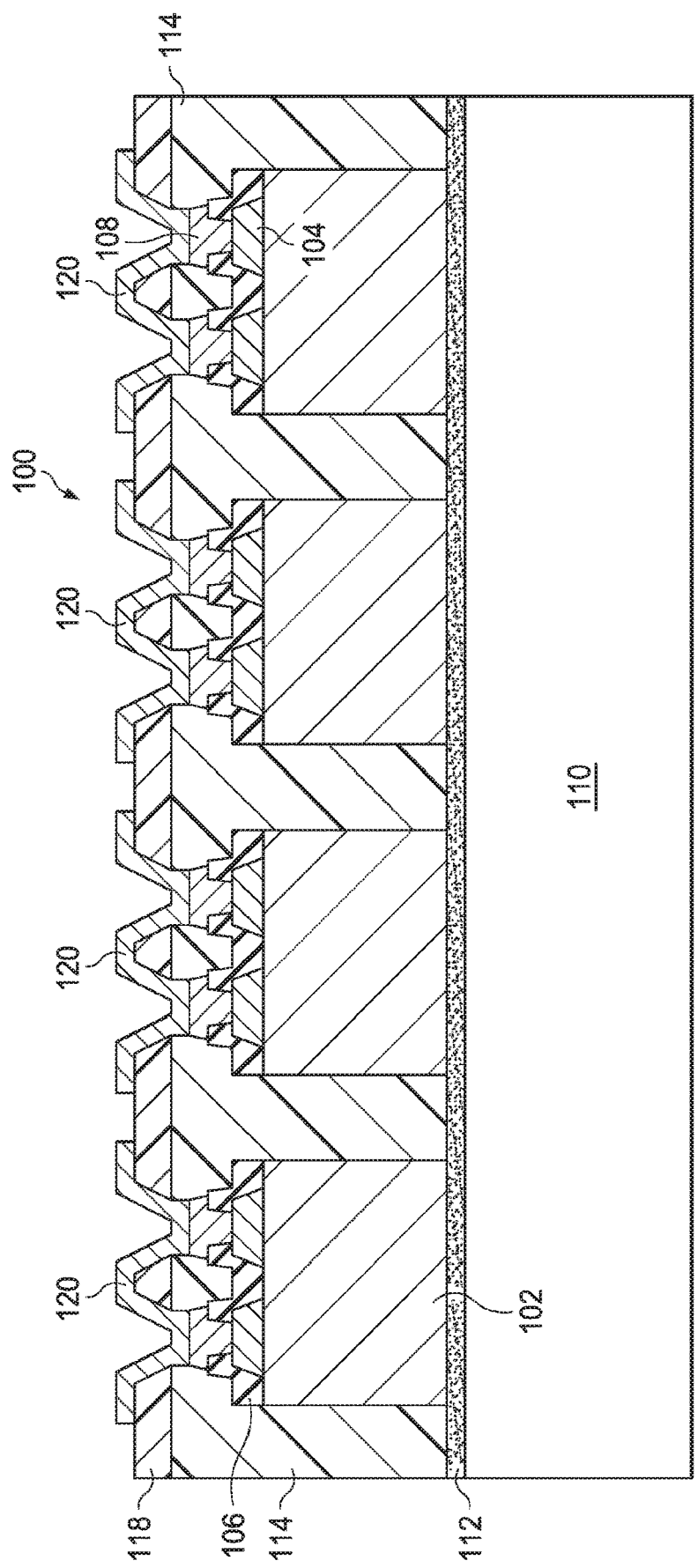

FIG. 2H illustrates the formation of a polymer layer 118 and redistribution layers (RDLs) 120 over dies 102 and molding compound 114. Polymer layer 118 may be formed of any suitable material such as polyimide (PI), polybenzoxazole (PBO), benzocyclobuten (BCB), epoxy, silicone, acrylates, nano-filled pheno resin, siloxane, a fluorinated polymer, polynorbornene, and the like. Polymer layer 118 may be blanket deposited to fill openings 116 using, for example, spin on coating techniques. Polymer layer 118 may then be patterned using, for example, a combination of photolithographic techniques and etching or laser drilling techniques to expose protective layer 108 in dies 102.

Alternatively, polymer 118 may be formed over molding compound 114 prior to the laser drilling molding compound 114 to form openings 116. In such embodiments, a single laser drilling process may be used to pattern polymer 118 and expose portions of protective layer 108.

RDLs 120 are formed over and extending into polymer layer 118. The formation of RDLs 120 may involve a seed layer and using a mask layer to define the shape of RDLs 120. RDLs 120 may be formed of copper or a copper alloy although other metals such as aluminum, gold, or the like may also be used. RDLs 120 may be electrically connected to contact pads 104 through protective layer 108, and contact pads 104 may electrically connect RDLs 120 to the various devices in dies 102. RDLs 120 may extend past edges of respective dies 102 in a lateral direction, thus forming fan-out packages. Although only one RDL 120 is shown over each die 102, in alternative embodiments, multiple RDLs may be formed over and be interconnected to RDL 120.

Figure 2I:
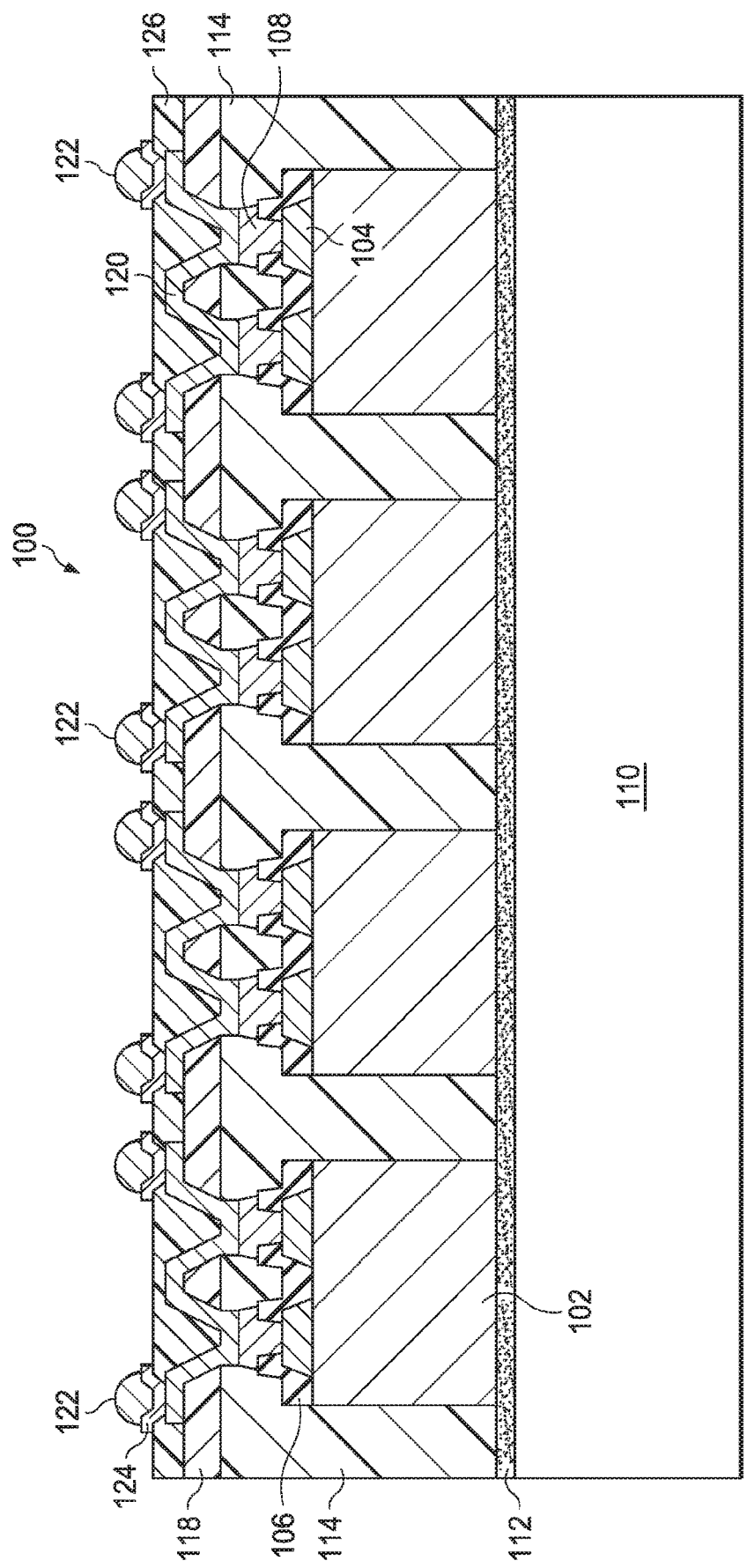

FIG. 2I illustrates the formation of another polymer layer 126 and conductive bumps 122 over RDLs 120. Polymer layer 126 may be substantially similar to polymer layer 118 both in composition and formation processes, and polymer layer 126 may act as a passivation layer or a planarization layer.

Conductive bumps 122 may be formed over UBMs 124 and are electrically connected to portions of RDLs 120. The UBMs may be formed of conductive materials such as copper, copper alloys, titanium, titanium alloys, or the like. Conductive bumps 122 may be reflowable bumps such as solder balls, which may include Sn—Ag, Sn—Cu, Sn—Ag—Cu, or the like. Alternatively conductive bumps 122 may be non-reflowable bumps such as copper bumps, and the like. Conductive bumps 122 are formed to electrically connect and bond other package components such as a wafer, a device die, an interposer, a printed circuit board (PCB), and the like to dies 102.

Figure 2J:
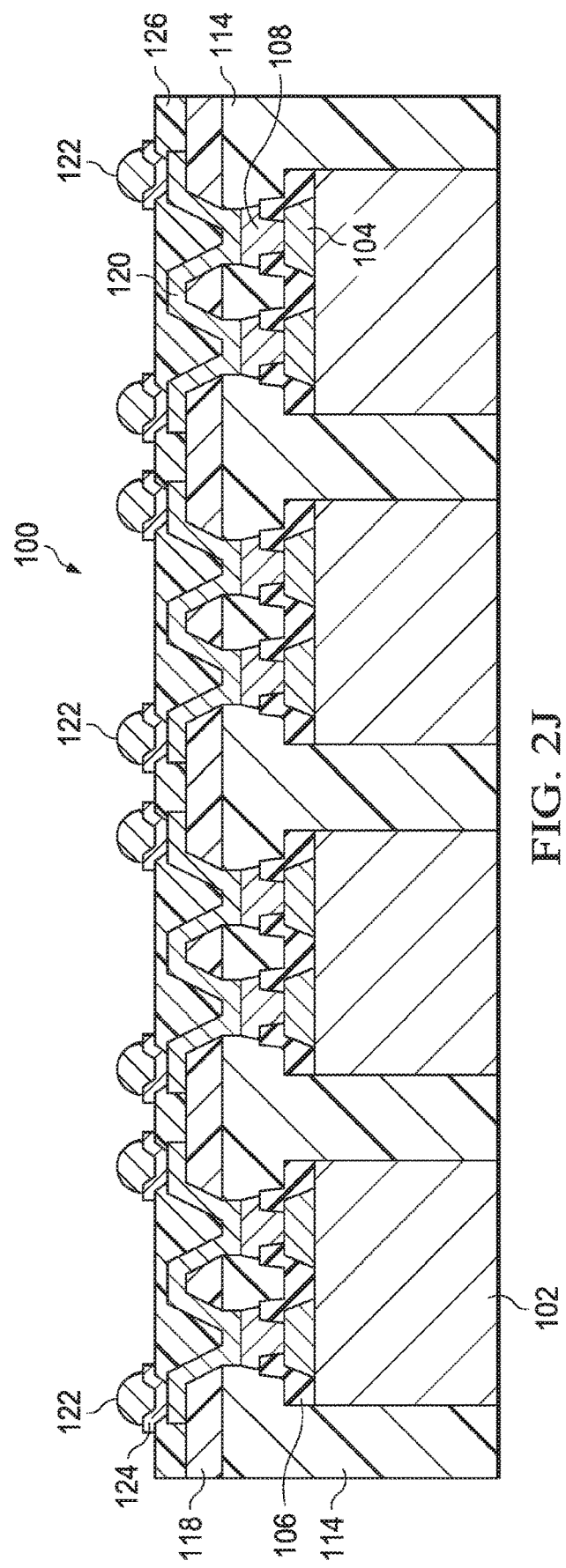

In FIG. 2J, carrier 110 and adhesive layer 112 are removed from dies 102 using any suitable method. For example, in an embodiment in which adhesive layer 112 is formed of UV tape, dies 102 may be removed by exposing adhesive layer 112 to UV light. Subsequently, dies 102 may be singulated for packaging in an IC package. The singulation of dies 102 may include the use of a suitable pick-and-place tool. In a top down view (not shown) of dies 102 molding compound 114 may contact the sidewalls of and encircle each die 102.

Referring back to FIG. 1A, a completed IC structure 130 is illustrated after dies 102 are singulated. A molding compound 114 surrounds die 102. Die 102 includes a contact pad on a top surface, the contact pad is electroless plated with a metallic protective layer 108. A RDL 120 is disposed over and extends into a polymer layer 118, and RDL 120 is electrically connected to devices in die 102 through protective layer 108 and contact pad 104. A second polymer layer 126 is formed over RDL 120 and polymer layer 118. A conductive bump 122 (e.g., a solder bump) is electrically connected to RDL 120 through a UBM 124 in polymer layer 126. Thus, through the various intermediary manufacturing steps described with respect to FIGS. 2A-2J, a fan-out interconnect package such as IC structure 130 may be formed using laser drilling. A protective layer may be used to prevent damage to contact pads of a die during the laser drilling. Laser drilling provides benefits over traditional photolithography and etching processes such as lower cost.

Figure 3:
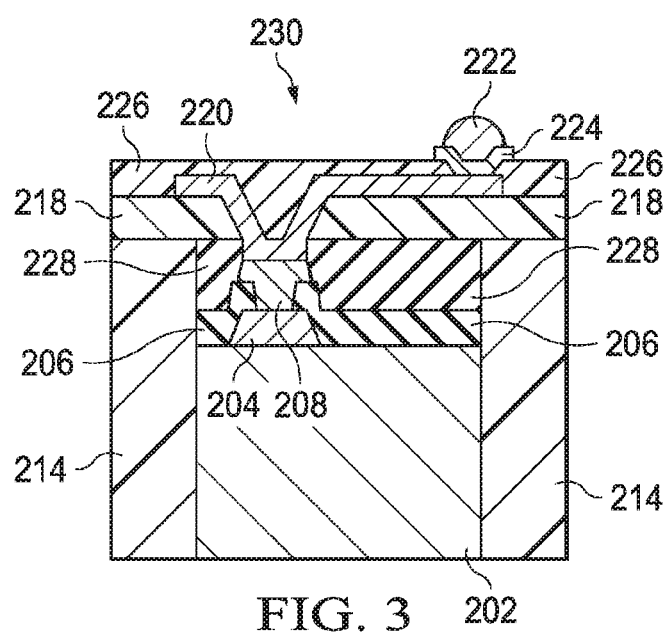
FIG. 3 is a cross sectional view of a fan-out package in accordance with various alternative embodiments.

FIG. 3 illustrates a cross-sectional view of an IC structure 230 in accordance with alternative embodiments. IC structure 230 is similar to IC structure 130 of FIG. 1A, wherein like reference numerals refer to like elements. However, IC structure 230 includes an additional polymer layer 228 disposed over and contacting a die 202. Polymer layer 228 may be a passivation layer, which helps prevents the oxidation of a metallic protective layer 208. Furthermore, the inclusion of polymer layer 228 may allow for improved alignment between RDL 220 and die 202.

Figure 4A:
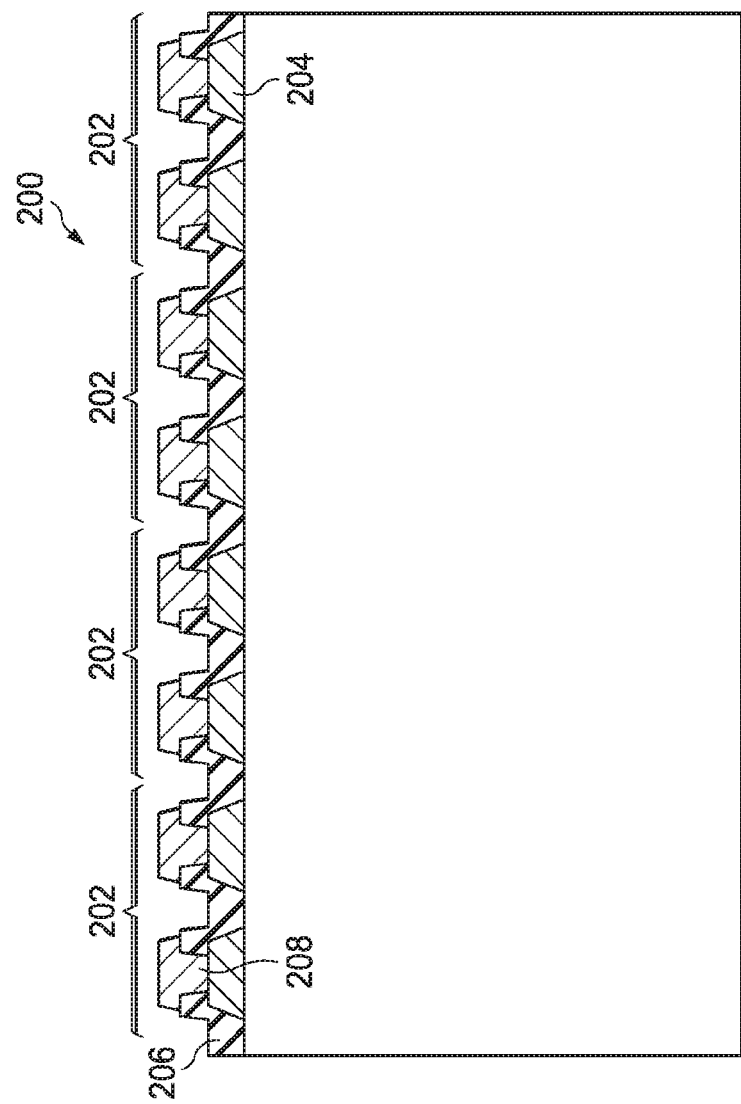
FIGS. 4A through 4F are cross-sectional views of various intermediary stages of manufacture of a fan-out package in accordance with various alternative embodiments.

FIGS. 4A-4F illustrate cross-sectional views of intermediate stages of manufacture of the IC structure 230 of FIG. 3 in accordance with various alternative embodiments. In FIG. 4A, various dies 202 are provided in a wafer 200. Dies 202 include contact pads 204 and a passivation layer 206, which may extend over and cover edge portions of contact pads 204. Metallic protective layer 208 covers contact pads 204 and may be formed of a metallic material having a relatively high melting point, for example, through electroless plating. The various features of dies 202 and protective layer 208 may be substantially similar to dies 102 and protective layer 108, respectively, in FIGS. 1 and 2A-2J. Thus, further description of these features is omitted for brevity.

Figure 4B:
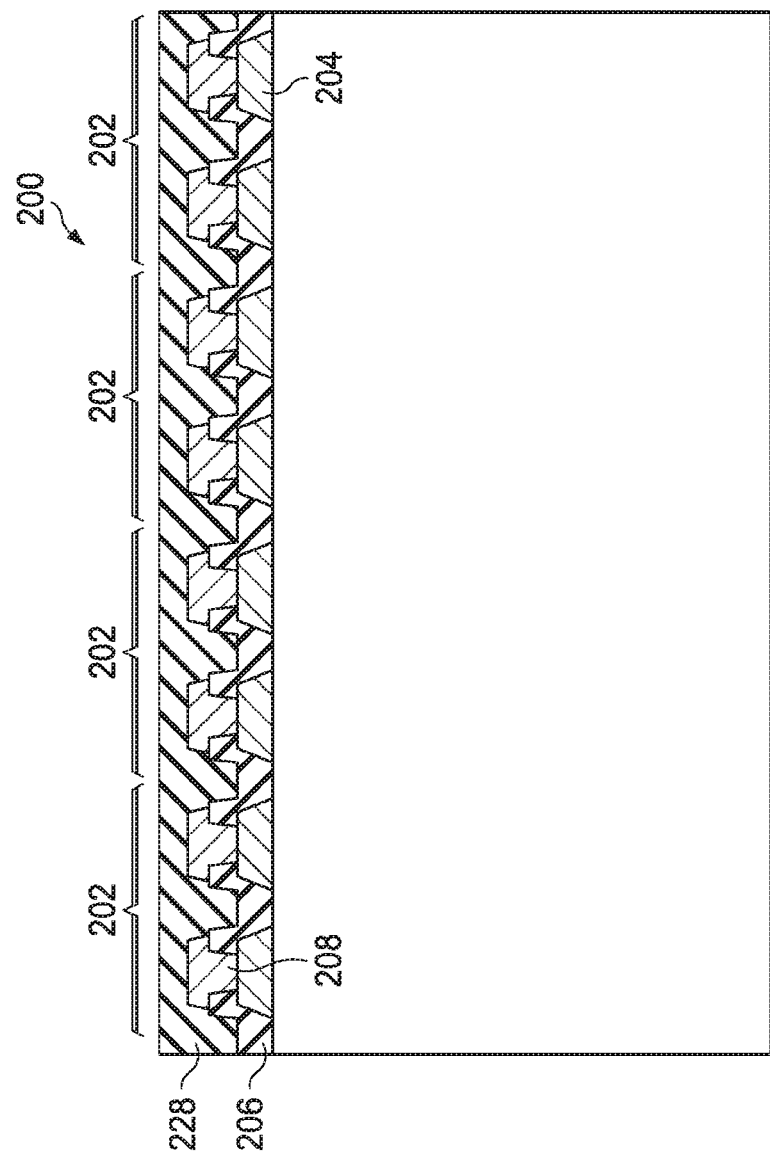

In FIG. 4B, a polymer layer 228 is formed over a top surface of dies 202 and covers protective layer 208. Polymer layer 228 may be substantially similar to polymer layer 118 of IC structure 130. For example, polymer layer 228 may be blanket deposited over dies 202 and be formed of any suitable material such as polyimide (PI), polybenzoxazole (PBO), benzocyclobuten (BCB), epoxy, silicone, acrylates, nano-filled pheno resin, siloxane, a fluorinated polymer, polynorbornene, and the like. Polymer layer 228 may be a passivation layer that prevents oxidation of the metallic material used for protective layer 208.

Figure 4C:
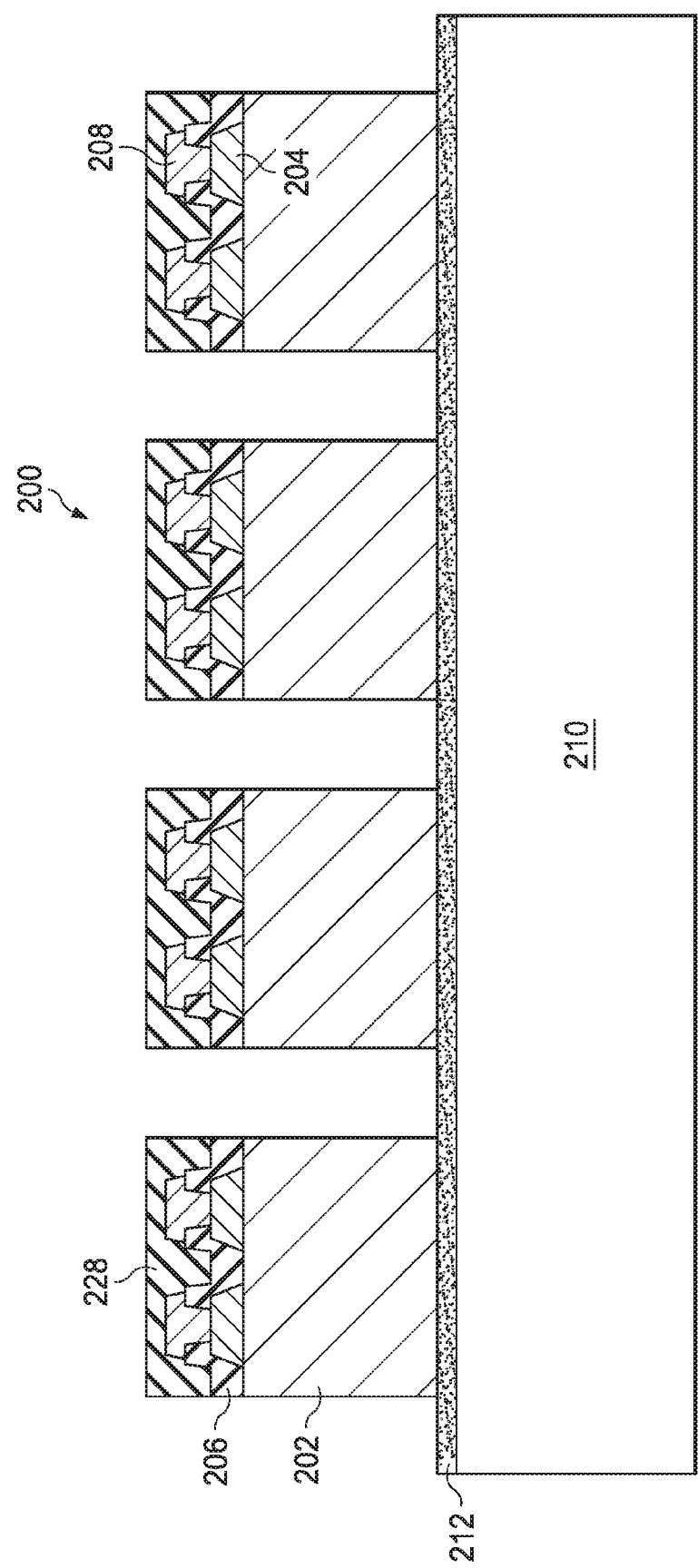

With reference now to FIG. 4C, dies 202 may then be singulated and attached to a carrier 210 through an adhesive layer 212. Carrier 210 and adhesive layer 212 may be substantially similar to carrier 110 and adhesive layer 112, respectively.

Figure 4D:
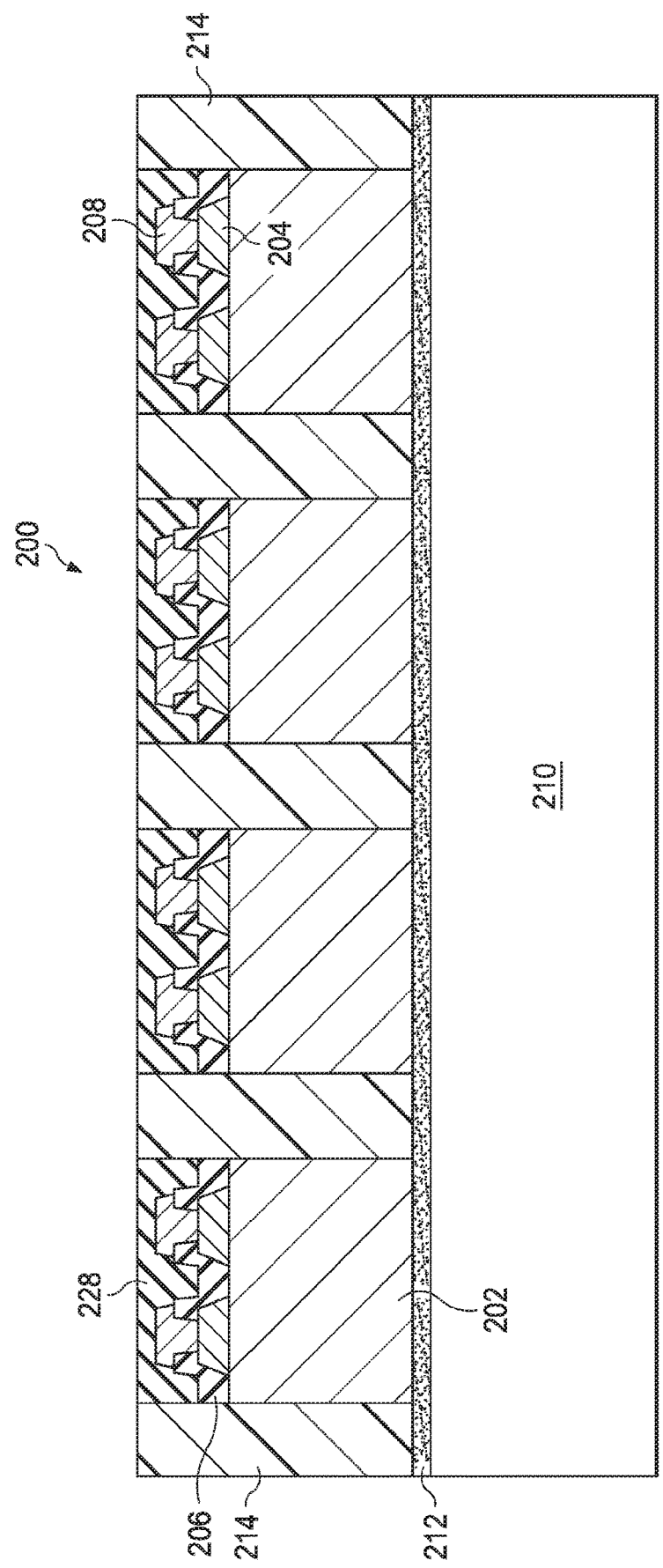

In FIG. 4D, a molding compound 214 may be used fill gaps between dies 202. Molding compound 214 may be any suitable material such as an epoxy resin, a molding underfill, or the like. Suitable methods for forming molding compound 214 may include compressive molding, transfer molding, liquid encapsulant molding, or the like. The filling of molding compound 214 may overflow dies 202 so that molding compound 214 covers a top surface of dies 202. Subsequently, a planarization process (e.g., a CMP or etchback technique) may be employed to remove excess portions of molding compound 214. The planarization process exposes polymer layer 228. As part of the planarization process, top portions of polymer layer 228 may also be removed to achieve a desired thickness. However, dies 202, passivation layer 206 and protective layer 208 may not be exposed.

Figure 4E:
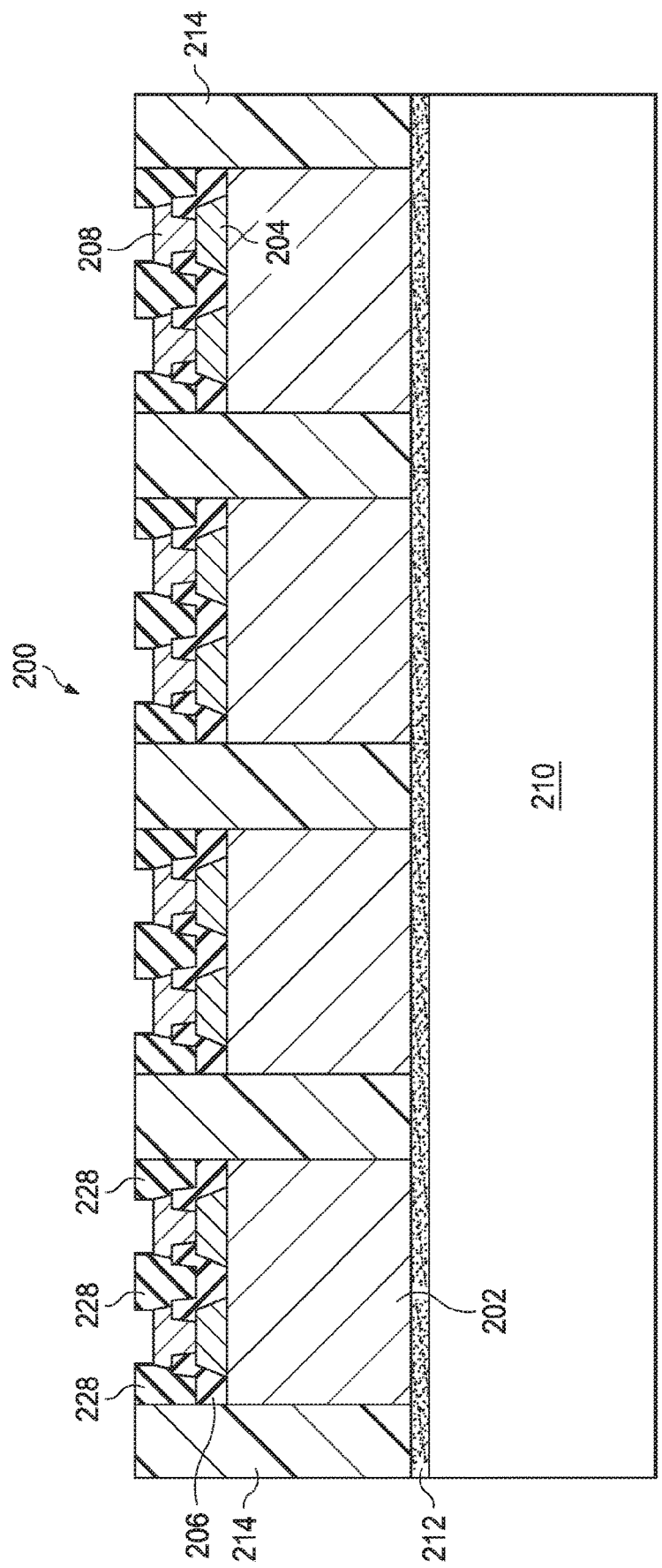

In FIG. 4E, openings are patterned into polymer layer 228 exposing protective layer 208. Polymer layer 228 may be patterned through a laser drilling process. The laser used in the laser drilling process may depend on layout design. For example, for finer pitched openings, an UV laser may be used while a $CO_2$ laser may be used for larger pitched openings. Obviously, other types of lasers may be used as well.

Figure 4F:
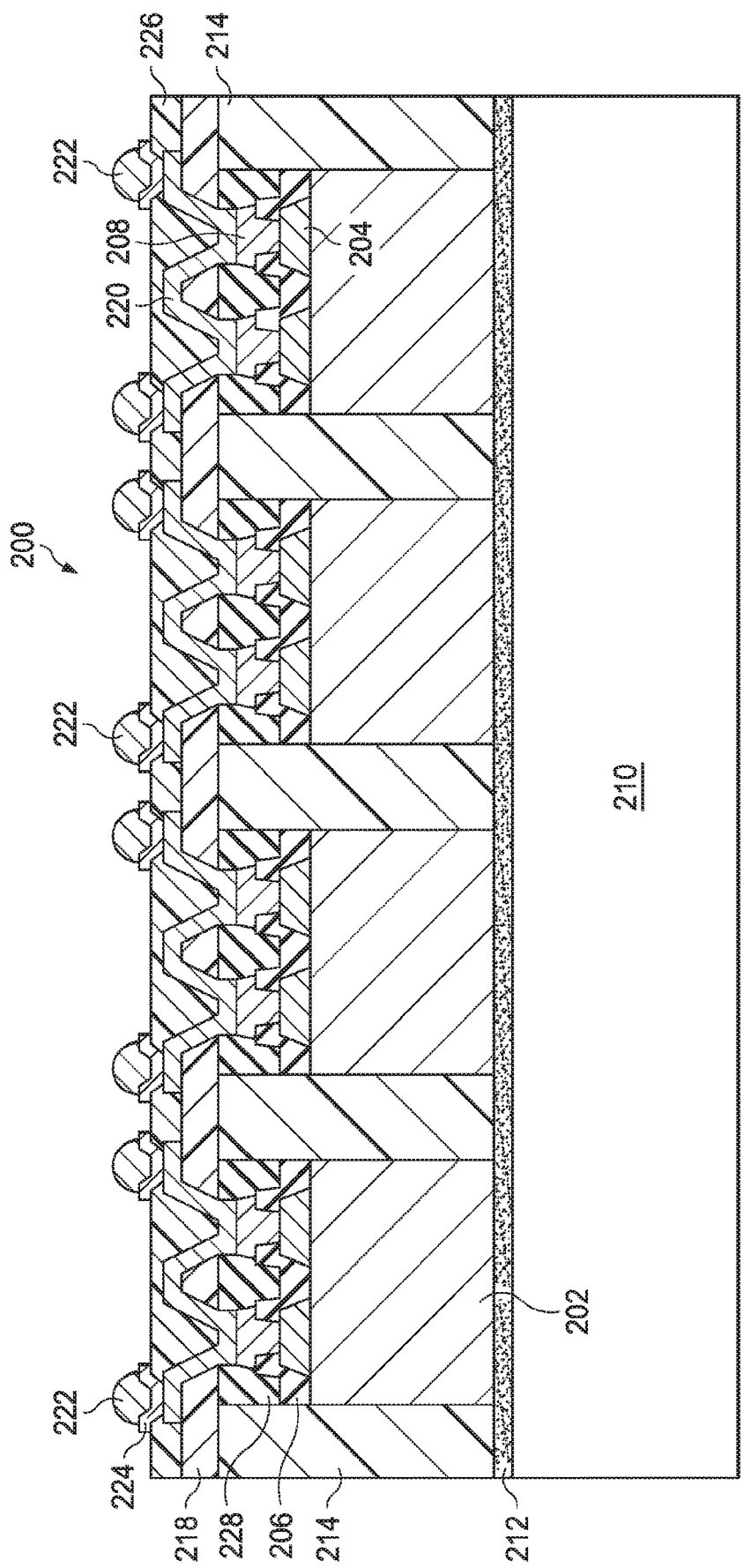

In FIG. 4F, polymer layers 218 and 226, RDLs 220, UBMs 224 (not shown in FIG. 4F, please refer to FIG. 3), and conductive bumps 222 may be formed over molding compound 214 and dies 202. These features may be substantially similar to like features in IC structure 130 of FIG. 1A and detailed description of their formation is omitted for brevity. Alternatively, polymer layer 218 may be formed over polymer layer 228 prior to the patterning of polymer layer 228. In such embodiments, a single laser drilling process may be used to pattern polymer layers 218 and 228 to expose protective layer 208.

Because molding compounds, such as molding compound 114 and 214, may include filler materials, connecting RDLs through a molding compound to underlying dies may suffer from alignment issues caused by the filler material interfering with the focus of alignment tools. Thus, the inclusion of polymer layer 228, which is generally free of such filler materials, between dies 202 and RDL 220 in lieu of a molding compound advantageously improves alignment.

Although only one RDL 220 is shown over each die 202, in alternative embodiments, multiple RDLs may be formed over and be interconnected to RDL 220. Conductive bumps 222, such as bond balls, may be formed over RDL 220. Subsequently, dies 202 may be removed from carrier 210 and singulated.

Referring back to FIG. 3, a completed IC structure 330 is illustrated after dies 202 are singulated. A RDL 220 is disposed over and extends past edges of die 202. RDL 220 is electrically connected to die 202 through contact pad 204, which is electroless plated with a metallic protective layer 208. A polymer layer 228 is disposed over die 202 and protective layer 208. Protective layer 208 may be a metallic paste layer having a relatively high melting point and formed through electroless plating. Polymer layer 228 may be a passivation that prevents oxidation of protective layer 208. Polymer layer 228 may also improve the alignment between RDL 220 and die 202. A conductive bump 222 (e.g., a solder bump) is electrically connected to RDL 220 through a UBM 224 in polymer layer 226. Thus, through the various intermediary manufacturing steps described with respect to FIGS. 4A-4F, a fan-out interconnect package such as IC structure 230 may be formed using laser drilling, which may be a lower cost alternative to photolithography and etching. Protective layer 208 prevents damage to contact pads 204 during the laser drilling process.

In accordance with an embodiment, a method for integrated circuit packaging includes providing a die having a contact pad on a top surface and forming a conductive protective layer over the die and covering the contact pad. A molding compound is formed over the die and the conductive protective layer. The conductive protective layer is exposed using a laser drilling process. A redistribution layer (RDL) is formed over the die. The RDL is electrically connected to the contact pad through the conductive protective layer.

In accordance with another embodiment, a method for integrated circuit packaging includes providing a die having one or more contact pads on a top surface and forming a conductive protective layer by electroless plating each of the one or more contact pads with a metallic material. A molding compound is formed over the die and the conductive protective layer. The conductive protective layer is exposed by laser drilling, and a redistribution layer (RDL) is formed over the die. The RDL extends through a first polymer layer over the conductive protective layer, and the RDL is electrically connected to the contact pad through the conductive protective layer.

In accordance with yet another embodiment, an integrated circuit (IC) structure includes a die. The die includes a contact pad on a top surface, wherein the contact pad is electroless plated with a metallic protective layer. The IC structure further includes a molding compound surrounding sidewalls of the die and a redistribution layer (RDL) over the die and the molding compound. The RDL is electrically connected to the contact pad.

In accordance with yet another embodiment, a method includes forming a contact pad over a substrate. A passivation layer is formed over the substrate and the contact pad. The passivation layer is patterned to form an opening in the passivation layer. The opening exposes a top surface of the contact pad. A conductive protective layer is formed in the opening, where a first conductive material is deposited in the opening, and a second conductive material different from the first conductive material is deposited over the first conductive material and the passivation layer. The second conductive material is in physical contacting with a top surface of the passivation layer. The substrate and the conductive protective layer are encapsulated in a molding compound. The molding compound extends along sidewalls of the substrate. A redistribution layer (RDL) is formed over the substrate. A portion of the RDL extends below a topmost surface of the molding compound and electrically contacts the conductive protective layer.

In accordance with yet another embodiment, a method includes forming a contact pad over a top surface of a substrate. A conductive protective layer is formed over the contact pad by electroless plating the contact pad with one or more conductive materials. After the conductive protective layer is formed over the contact pad, a bottom surface of the substrate is attached to a carrier. A molding compound is formed over the carrier, the substrate and the conductive protective layer. The molding compound extends along sidewalls of the substrate. A thickness of the molding compound is reduced. After the thickness of the molding compound is reduced and while the bottom surface of the substrate is attached to the carrier, the conductive protective layer is exposed by laser drilling. A redistribution layer (RDL) is formed over the substrate. The RDL is electrically connected to the contact pad through the conductive protective layer.

In accordance with yet another embodiment, a device includes a contact pad over a substrate, a passivation layer over and covering edges of the contact pad, and a conductive protective layer over the contact pad. The conductive protective layer includes a first portion comprising a first conductive material, the first conductive material extending through the passivation layer and being in physical contact with the contact pad, and a second portion over the first portion, the second portion comprising a second conductive material different from the first conductive material, the second conductive material extending along and being in physical contact with a top surface of the passivation layer. The device further includes a molding compound extending along sidewalls of the substrate and the passivation layer, and a redistribution layer (RDL) over the substrate and the molding compound, a first portion of the RDL extending below a topmost surface of the molding compound and physically contacting the conductive protective layer.

In accordance with yet another embodiment, a method includes forming a contact pad over a substrate. A passivation layer is formed over the substrate and the contact pad. A first opening is formed in the passivation layer. The first opening exposes a top surface of the contact pad. A conductive protective layer is formed in the first opening. Forming the conductive protective layer includes depositing a first conductive material in the first opening. The first conductive material is in physical contact with a sidewall of the first opening. A second conductive material is deposited over the first conductive material and the passivation layer. The second conductive material is different from the first conductive material. The second conductive material is in physical contact with a top surface of the passivation layer. A portion of the second conductive material laterally extends beyond an outermost sidewall of the first conductive material at the end of depositing the second conductive material.

In accordance with yet another embodiment, a method includes forming a contact pad over a substrate. A conductive protective layer is formed over the contact pad. Forming the conductive protective layer includes electroless plating the contact pad with a first conductive material. The first conductive material is electroless plated with a second conductive material different from the first conductive material. A maximum width of the second conductive material is greater than a maximum width of the first conductive material at the end of electroless plating the first conductive material with the second conductive material.

In accordance with yet another embodiment, a device includes a contact pad over a substrate, a passivation layer over and covering edges of the contact pad, and a conductive protective layer over the contact pad. The conductive protective layer includes a first portion including a first conductive material and a second portion over the first portion. The first conductive material extends through the passivation layer and is in physical contact with the contact pad. The second portion includes a second conductive material different from the first conductive material. The second conductive material extends along and is in physical contact with a top surface of the passivation layer. A maximum width of the second conductive material is greater than a maximum width of the first conductive material.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a contact pad over a substrate;
   forming a passivation layer over the substrate and the contact pad;
   forming a first opening in the passivation layer, the first opening exposing a top surface of the contact pad; and
   forming a conductive protective layer in the first opening, wherein forming the conductive protective layer comprises:
      depositing a first conductive material in the first opening, the first conductive material being in physical contact with a sidewall of the first opening, wherein a width of the first conductive material decreases as the first conductive material extends toward the top surface of the contact pad; and
      depositing a second conductive material over the first conductive material and the passivation layer, the second conductive material being different from the first conductive material, the second conductive material being in physical contact with a top surface of the passivation layer, a portion of the second conductive material laterally extending beyond an outermost sidewall of the first conductive material at the end of depositing the second conductive material.

2. The method of claim 1, further comprising forming a molding compound over the substrate and the conductive protective layer.

3. The method of claim 2, further comprising, before forming the molding compound, depositing a polymer layer over the passivation layer and the conductive protective layer, the polymer layer being in physical contact with the second conductive material of the conductive protective layer.

4. The method of claim 2, further comprising forming a redistribution layer (RDL) over the substrate and the molding compound, a portion of the RDL extending below a topmost surface of the molding compound and being in physical contact with the second conductive material of the conductive protective layer.

5. The method of claim 4, wherein forming the RDL comprises:
   forming a second opening in the molding compound, the second opening exposing the second conductive material of the conductive protective layer; and
   depositing a third conductive material in the second opening.

6. The method of claim 5, wherein forming the second opening in the molding compound comprises performing a laser drilling process.

7. The method of claim 1, wherein the first conductive material is nickel and the second conductive material is copper.

8. A method comprising:
   forming a contact pad over a substrate;
   forming a conductive protective layer over the contact pad, wherein forming the conductive protective layer comprises:
      electroless plating the contact pad with a first conductive material; and
      electroless plating the first conductive material with a second conductive material different from the first conductive material, a maximum width of the second conductive material being greater than a maximum width of the first conductive material at the end of electroless plating the first conductive material with the second conductive material;
   before forming the conductive protective layer, forming a passivation layer over the contact pad, the first conductive material of the conductive protective layer extending through the passivation layer; and
   encapsulating the substrate in a molding compound, the molding compound being in physical contact with a sidewall of the substrate and a sidewall of the passivation layer.

9. The method of claim 8, wherein the second conductive material is in physical contact with a top surface of the passivation layer.

10. The method of claim 8, wherein the molding compound is in physical contact with a top surface of the passivation layer.

11. The method of claim 8, further comprising forming a redistribution layer (RDL) over the substrate and the molding compound, the RDL being in electrical contact with the conductive protective layer.

12. The method of claim 8, wherein a top surface of the molding compound is above a top surface of the conductive protective layer.

13. The method of claim 8, wherein a top surface of the molding compound is above a top surface of the passivation layer.

14. A device comprising:
a contact pad over a substrate;
a passivation layer over and covering edges of the contact pad;
a conductive protective layer over the contact pad, the conductive protective layer comprising:
a first portion comprising a first conductive material, the first conductive material extending through the passivation layer and being in physical contact with the contact pad; and
a second portion over the first portion, the second portion comprising a second conductive material different from the first conductive material, the second conductive material extending along and being in physical contact with a top surface of the passivation layer, a maximum width of the second conductive material being greater than a maximum width of the first conductive material; and
a molding compound extending along a sidewall of the substrate and a sidewall of the passivation layer.

15. The device of claim 14, wherein the molding compound is in physical contact with the top surface of the passivation layer.

16. The device of claim 14, further comprising a redistribution layer (RDL) over the substrate and the molding compound, a portion of the RDL extending below a topmost surface of the molding compound and physically contacting the second portion of the conductive protective layer.

17. The device of claim 14, further comprising a polymer layer over the passivation layer, the polymer layer being in physical contact with the second portion of the conductive protective layer.

18. The device of claim 17, wherein the molding compound is in physical contact with a sidewall of the polymer layer.

19. The device of claim 14, wherein the first conductive material is nickel and the second conductive material is copper.

20. The device of claim 14, wherein an angle between a line tangent to a sidewall of the second portion of the conductive protective layer and the top surface of the passivation layer is between about 45° and about 90°.

* * * * *